United States Patent
Kang et al.

(10) Patent No.: US 7,652,926 B2
(45) Date of Patent: Jan. 26, 2010

(54) NONVOLATILE SEMICONDUCTOR MEMORY DEVICE INCLUDING A CELL STRING WITH DUMMY CELLS

(75) Inventors: Sang Gu Kang, Suwon-si (KR); Yun Seung Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 287 days.

(21) Appl. No.: 11/715,365

(22) Filed: Mar. 8, 2007

(65) Prior Publication Data

US 2007/0223273 A1 Sep. 27, 2007

(30) Foreign Application Priority Data

Mar. 27, 2006 (KR) .................. 10-2006-0027247

(51) Int. Cl.
*G11C 16/06* (2006.01)
(52) U.S. Cl. ............. 365/185.2; 365/210.1; 365/185.17
(58) Field of Classification Search ............ 365/185.17, 365/185, 185.2, 210.1
See application file for complete search history.

(56) References Cited

U.S. PATENT DOCUMENTS

| | | | |
|---|---|---|---|
| 7,079,437 B2* | 7/2006 | Hazama et al. | 365/210.12 |
| 7,272,049 B2* | 9/2007 | Kang et al. | 365/185.2 |
| 2005/0180213 A1* | 8/2005 | Abe et al. | 365/185.17 |
| 2006/0239077 A1* | 10/2006 | Park et al. | 365/185.17 |
| 2009/0046505 A1* | 2/2009 | Lee et al. | 365/185.2 |

FOREIGN PATENT DOCUMENTS

| | | |
|---|---|---|
| JP | 2004127346 | 4/2004 |
| JP | 2005235260 | 9/2005 |
| KR | 1020050021616 A | 3/2005 |

\* cited by examiner

*Primary Examiner*—Vu A Le
*Assistant Examiner*—Han Yang
(74) *Attorney, Agent, or Firm*—Volentine & Whitt, PLLC

(57) ABSTRACT

A non-volatile semiconductor memory device includes a memory array having a cell string. The cell string includes a plurality of normal memory cells, a ground selection transistor gated so as to provide a source voltage to the normal memory cells, at least two dummy cells connected between a normal memory cell on one side end of the cell string and the ground selection transistor, wherein the normal memory cells are configured to store data and the dummy cells are configured to not store data. The memory device also includes a word line selection block which controls normal word lines to gate the normal memory cells and dummy word lines to gate the dummy cells, wherein the dummy word lines are controlled as sequential voltage levels during a program operation to select the normal memory cell on the one side end.

16 Claims, 11 Drawing Sheets

NONVOLATILE SEMICONDUCTOR MEMORY DEVICE INCLUDING A CELL STRING WITH DUMMY CELLS

BACKGROUND OF THE INVENTION

1. Field of the Invention

The present disclosure relates generally to a semiconductor memory device and, more particularly, to a nonvolatile semiconductor device containing cell strings with dummy memory cells.

2. Description of the Related Art

Nonvolatile semiconductor memory devices include both NAND type memory devices and NOR type memory devices. Both types of memory devices include memory cells. Specifically, in a NAND-type nonvolatile semiconductor memory device, pluralities of memory cells are connected in series to form cell strings. Furthermore, each memory cell includes a floating and a control gate. The floating and control gates are separated by a channel region.

In the nonvolatile semiconductor device having the above-mentioned structure, a data bit is programmed or erased by conditioning a predetermined voltage difference between the control gate and the channel region. With this voltage condition, electrons are injected into the floating gate from the channel region through a tunneling current. Alternatively, the electrons escape from the floating gate into the channel region. In addition, a potential at the floating gate is determined by a ratio of the capacitance between the control and floating gates and the capacitance between the floating gate and the channel region.

FIG. 1 is a circuit diagram showing a cell string in a conventional nonvolatile semiconductor memory device. Referring to FIG. 1, one end of the conventional cell string is connected to a bitline BL through a selection transistor SST, while the other end of the cell string is connected to a source line SL through the other selection transistor GST. These days, there is a high demand for semiconductor devices having high integration densities. Therefore, because the nonvolatile semiconductor memory device has a high integration density, distances between adjacent memory cells MC1~MC32 are being reduced. Because of this reduction in the distance between adjacent memory cells, the floating gate of the memory cell attains additional significance. This additional significance exists because of the capacitance between floating and control gates of an adjacent memory cells, and also because of the capacitance between the floating gate and the channel region of the memory cell.

Referring to FIG. 1, the memory cells MC1 and MC32 are adjacent to the selection transistors GST and SST, respectively. Furthermore, the memory cells MC2 and MC31 are located at the side of memory cells MC1 and MC32 respectively. In addition, as mentioned above, the selection transistors GST and SST are located at the far ends of the string by the side of memory cells MC1 and MC32, respectively.

The selection transistors GST and SST are dissimilar from the memory cells MC1~MC32 in terms of structure and operational characteristics. For example, the operational voltages of the selection transistors GST and SST may be different than those of memory cells MC1~MC32. Because memory cells MC1 and MC32 are very close to the selection transistors GST and SST respectively, it may be possible that capacitive coupling between the adjacent transistors may affect the characteristics of memory cells MC1 and MC32. In particular, the characteristics of memory cells MC1 and MC32 may change to the extent that certain characteristics of memory cells MC1 and MC32 may differ from those of the other memory cells MC2~MC31. These characteristics may include, for example, the capacitance within the memory cells.

Thus, there may be a problem in a conventional nonvolatile semiconductor memory device that the outer memory cells MC1 and MC32 adjacent to the selection transistors GST and SST respectively, operate with operating characteristics that are different from those of the other memory cells MC1~MC31.

In addition, a conventional semiconductor device may also have a problem of insulation degradation. Particularly, on a conventional semiconductor memory device, the insulating layers between the gates of memory cells MC1, MC32 and the gates of selection transistors GST, SST may be degraded.

For example, as shown in FIG. 2, at a particular stage of programming a memory cell MC1, a word line WL1 gating the memory cell MC1 is controlled at a program voltage Vpgm (e.g., 24V), while the ground selection signal GSL is controlled at a ground voltage VSS. In this case, a large voltage gap is generated between the word line WL1 and the ground selection signal GSL, as shown in FIG. 3. This large voltage gap may cause the insulating layer between the gate G of the ground selection signal GST and the control gate CG of the memory cell MC1 to be degraded.

In addition, as shown in FIG. 4, at a particular stage of programming a memory cell MC32, a large voltage gap is generated between the word line WL32 and the string selection signal SSL. This large voltage gap may cause the insulating layer between the gate G of the string selection signal SST and the control gate CG of the memory cell MC32 to be degraded.

The present disclosure is directed towards overcoming one or more problems associated with the prior art semiconductor memory device.

SUMMARY OF THE INVENTION

One aspect of the present disclosure includes a non-volatile semiconductor memory device. The memory device includes a memory array having a cell string. The cell string includes a plurality of normal memory cells connected serially to each other. The cell string also includes a ground selection transistor gated so as to provide a source voltage to the normal memory cells. The cell string also includes at least two dummy cells connected serially between a normal memory cell on one side end of the cell string and the ground selection transistor, wherein the plurality of normal memory cells and the dummy cells are non-volatile, the normal memory cells being configured to store data and the dummy cells being configured to not store data. In addition, the memory device includes a word line selection block which controls normal word lines to gate the normal memory cells and dummy word lines to gate the dummy cells, wherein the dummy word lines are controlled as sequential voltage levels during a program operation to select the normal memory cell on the one side end, the sequential voltage levels being between a voltage level of a signal gating the ground selection transistor and a voltage level of a normal word line gating the normal memory cell on the one side end.

Yet another aspect of the present disclosure includes a non-volatile semiconductor memory device. The memory device includes a memory array having a cell string. The cell string includes a plurality of normal memory cells connected serially to each other. The cell string also includes a string selection transistor, gated so as to electrically connect the normal memory cells with a bitline. The cell string also includes at least two dummy cells being connected serially between a normal memory cell on one side end of the cell string and the string selection transistor, wherein the plurality of normal memory cells and the dummy cells are non-volatile, the normal memory cells being configured to store data and the dummy cells being configured to not store data. The memory device also includes a word line selection block which controls normal word lines to gate the normal memory cells and dummy word lines to gate the dummy cells, wherein the dummy word lines of the dummy cells are controlled as sequential voltage levels during a program operation to select the normal memory cell on the one side end, the sequential voltage levels being between a voltage level of a signal gating the string selection transistor and a voltage level of the normal word line gating the normal memory cell of the one side end.

Yet another aspect of the present disclosure includes a non-volatile semiconductor memory device. The memory device includes a memory array having a cell string. The cell string includes a plurality of normal memory cells connected serially to each other. The cell string also includes a ground selection transistor gated so as to provide a source voltage to the normal memory cells. The cell string also includes a first and a second dummy cell being connected serially between a normal memory cell on one side end of the cell string and the ground selection transistor. The cell string also includes a string selection transistor gated so as to electrically connect the normal memory cells with a bitline. In addition, the cell string includes a third and a fourth dummy cell being connected serially between a normal memory cell on the other side end of the cell string and the string selection transistor, wherein the plurality of normal memory cells and the dummy cells are non-volatile, the normal memory cells being configured to store data and the dummy cells being configured to not store data. The memory device also includes a word line selection block which controls normal word lines to gate the normal memory cells and dummy word lines to control a first, a second, a third, and a fourth dummy word line to gate the first, the second, the third and the fourth dummy cells, respectively, wherein the first and the second dummy word lines are controlled as first sequential voltage levels during a program operation to select the normal memory cell on the one side end, the first sequential voltage levels being between a voltage level of a signal gating the ground selection transistor and a voltage level of a normal word line gating the normal memory cell on the one side end.

BRIEF DESCRIPTION OF THE DRAWINGS

The accompanying drawings are included to provide a further understanding of the invention, and are incorporated in and constitute a part of this specification. The drawings illustrate exemplary embodiments of the present invention and, together with the description, serve to explain principles of the present invention. In the drawings.

DESCRIPTION OF THE PREFERRED EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, one or more exemplary embodiments of the present invention will be described in conjunction with the accompanying drawings.

Figure 1:
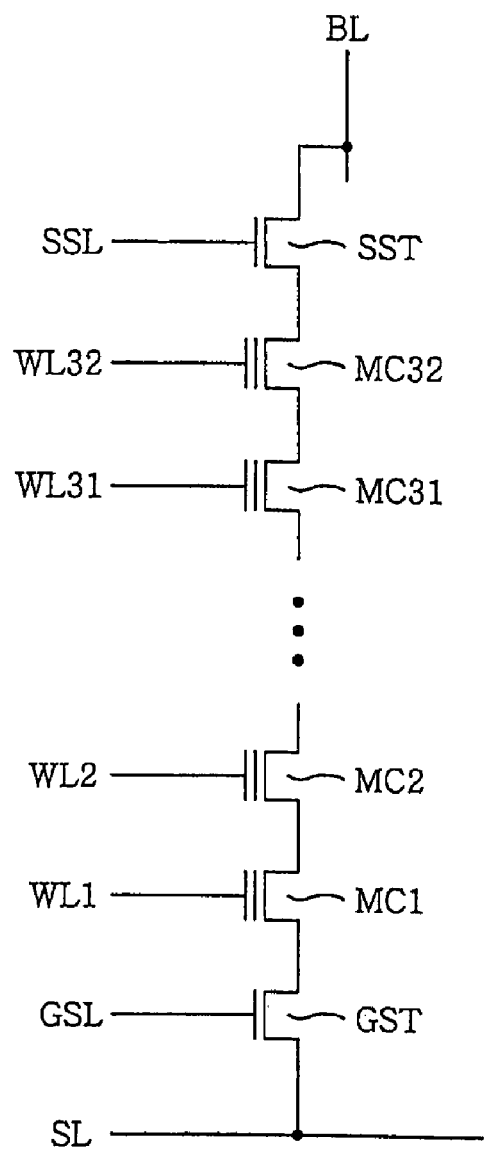
FIG. 1 is a circuit diagram showing a cell string in a conventional nonvolatile semiconductor memory device.
Figure 2:
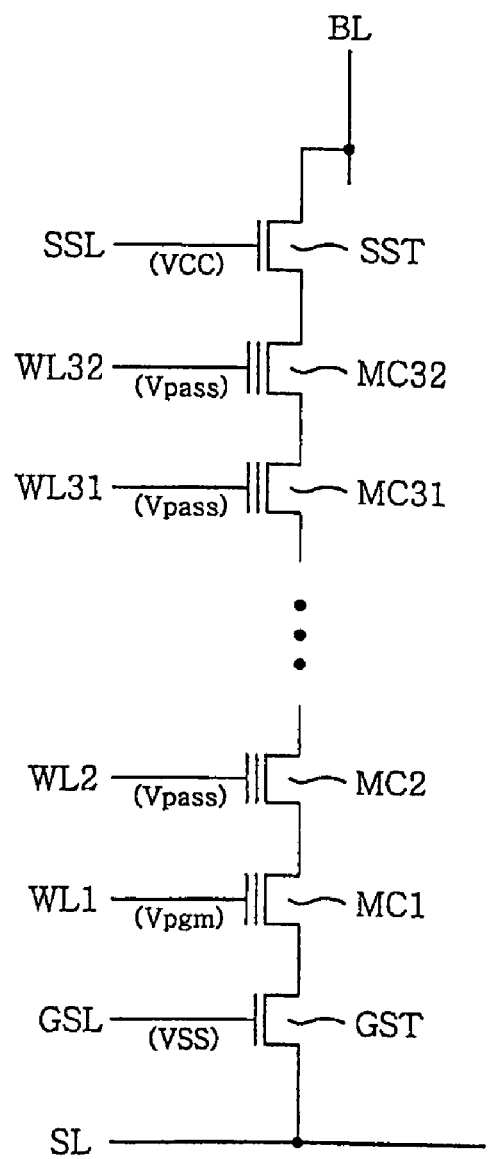
FIG. 2 and FIG. 3 are a circuit diagram and cross sectional view respectively, for explaining various voltages during a program operation for programming the memory cell on one side end of the cell string of FIG. 1.
Figure 3:
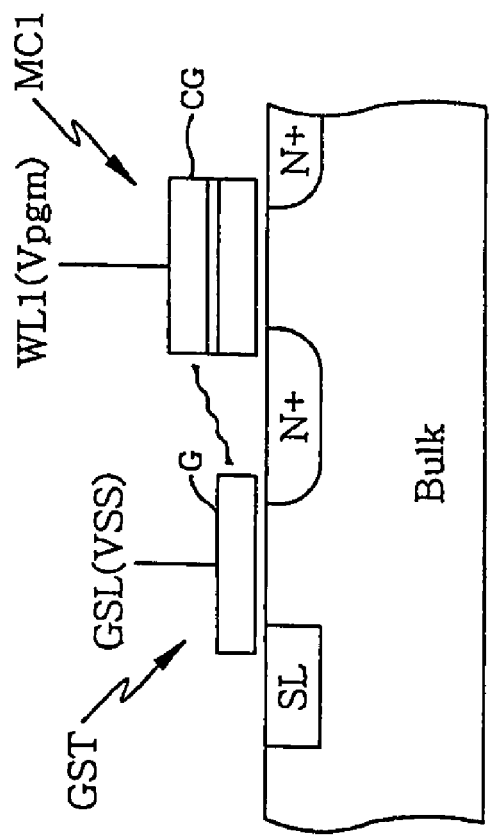
Figure 4:
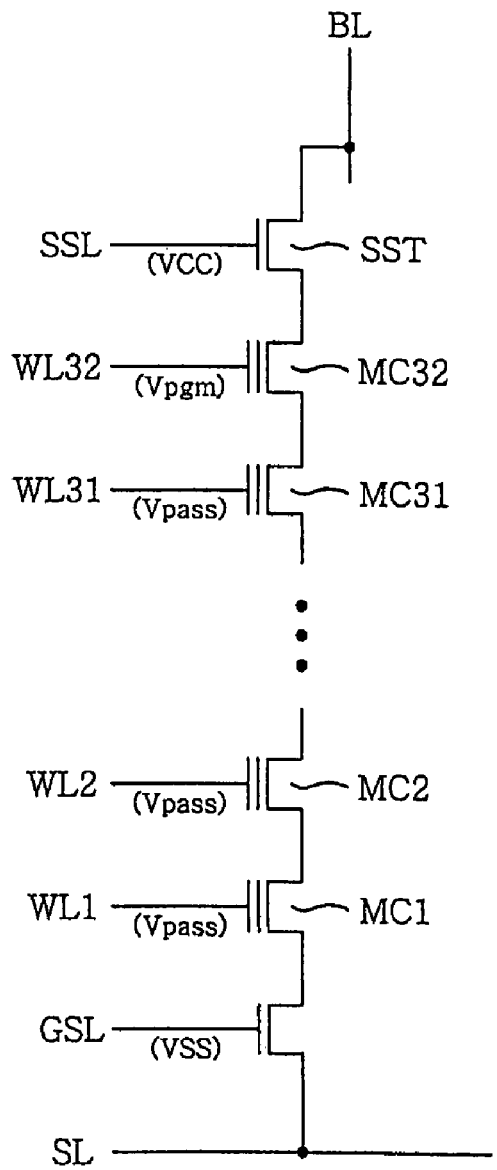
FIG. 4 is a circuit diagram for explaining various voltages during a program operation for programming the memory cell on the other side end of the cell string of FIG. 1.
Figure 5:
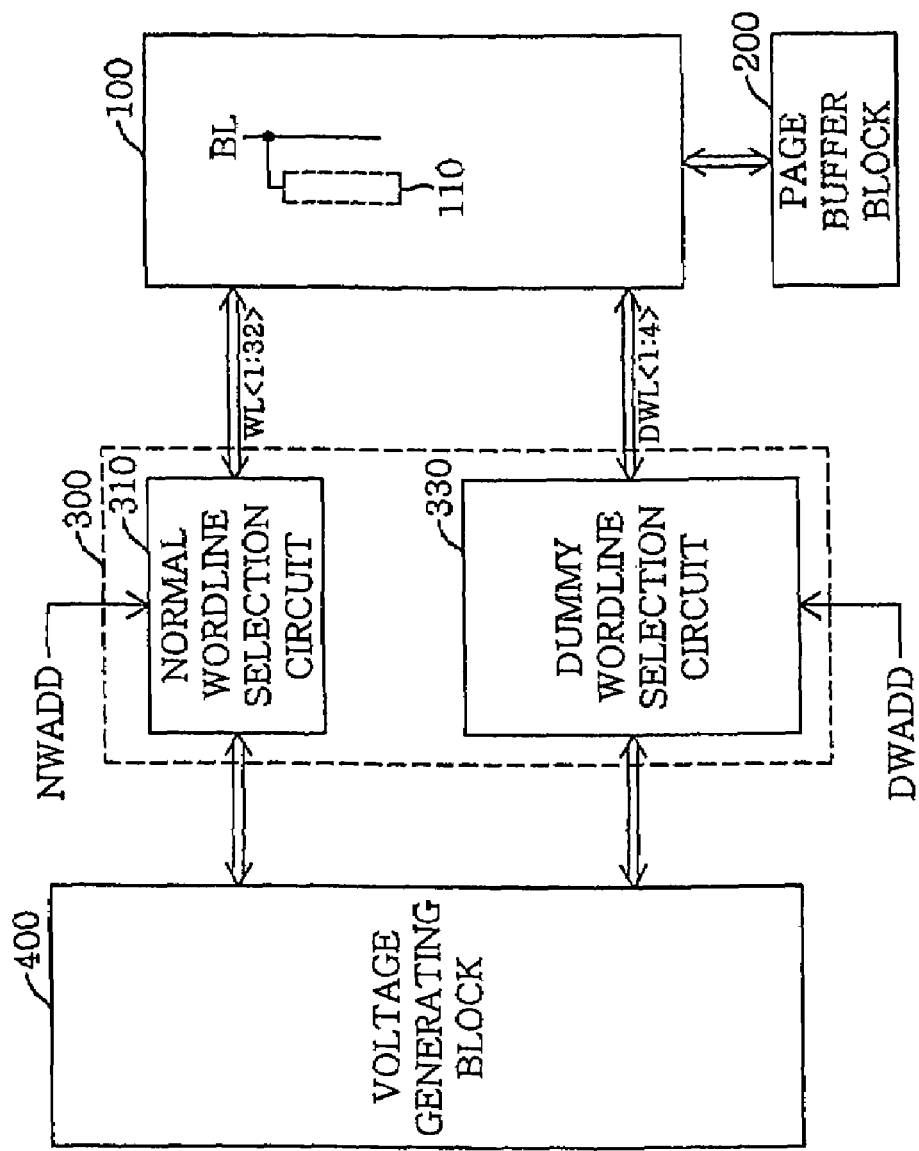
FIG. 5 is a block diagram illustrating a nonvolatile semiconductor memory device in accordance with an exemplary embodiment of the invention.

FIG. 5 is a block diagram illustrating an exemplary disclosed embodiment of a nonvolatile semiconductor memory device. The disclosed device includes a cell array 100, a page buffer block 200, a driver block 300, and a voltage generating block 400.

The cell array 100 includes pluralities of bitlines BL arranged in constant intervals. In addition, the cell array also includes pluralities of cell strings 110 coupled with the bitlines BL corresponding thereto.

The page buffer block 200 includes pluralities of page buffers connected correspondingly to the bitlines BL of the cell array 100. Each page buffer functions as a detection circuit which senses a data bit from a corresponding bitline BL. In addition or alternatively, each page buffer functions as a data latch which temporarily holds a data bit communicated with the bitline BL.

As mentioned above, the disclosed memory device also includes the driver block 300. The driver block 300 may be used to select and drive normal wordlines WL1~WL32 and dummy wordlines DWL1~DWL4 in the cell array 100. To this end, the driver block 300 includes a normal wordline selection circuit 310 and a dummy wordline selection circuit 330. The normal wordline selection circuit 310 is used to select the normal wordlines WL1~WL32 from the cell array 100. Similarly, the dummy wordline selection circuit 330 is used to select the dummy wordlines DWL1~DWL4 in the cell array 100.

Figure 6:
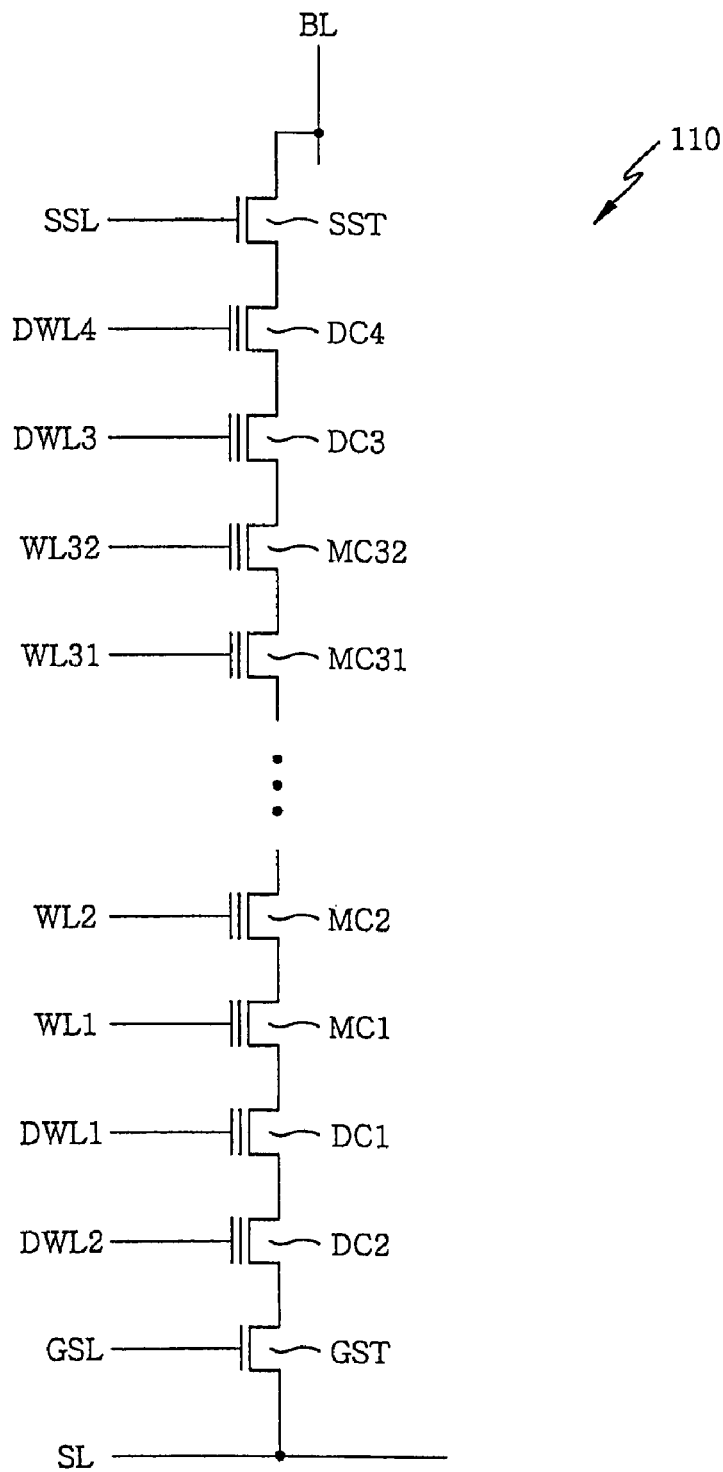
FIG. 6 is a drawing illustrating an example of the cell string of FIG. 5.

FIG. 6 is a circuit diagram illustrating detailed configurations of the cell array 100 and the driver block 300 shown in FIG. 5.

Referring to FIG. 6, as discussed above, the cell array 100 is comprised of the plural bitlines BL arranged in constant intervals and the plurality of cell strings 110. Furthermore, each cell string is connected to a corresponding bitline BL. Each cell string 110 may include a number of memory cells. For example, each cell string 110 is composed of a plurality of normal memory cells MC1~MC32, a ground selection transistor GST, a string selection transistor SST, and a first through fourth dummy cell DC1 through DC4, respectively.

In an exemplary embodiment, the normal memory cells MC1~MC32 and the dummy memory cells DC1~DC4 may be formed with one or more MOS transistors. A MOS transistor typically includes a control gate and a floating gate. This structure of the normal memory cells MC1~MC32 and the dummy memory cells DC1~DC4 may be similar to that of a memory cell of a conventional nonvolatile semiconductor device.

The memory cells MC1~MC32 and the dummy memory cells DC1~DC4 are electrically programmable and erasable. Furthermore, there is no loss of the data stored in the memory cells MC1~MC32 and the dummy memory cells DC1~DC4 in the event of a loss of power supply to these memory cells.

The cells in the cell string 110 may be arranged in various configurations. For example, the memory cells MC1~MC32 are connected in series with each other. Furthermore, the ground selection transistor GST and the string selection transistor SST are each connected to both ends of the cell string 110 in series. Namely, the string selection transistor SST connects the memory cells MC1~MC32 to the bitline BL in response to the string selection signal SSL. Similarly, the ground selection transistor GST connects the memory cells MC1~MC32 to the source line SL in response to the ground selection signal GSL.

It is generally beneficial for the first and second selection transistors SST and GST to be designed with gate widths larger than those of the transistors forming the memory cells MC1~MC32.

In an exemplary embodiment, the first, the second, the third, and the fourth dummy cells, DC1, DC2, DC3, and DC4 respectively, are not used for storing data. Instead, these dummy cells are used to shield the normal memory cells MC1~MC32 from the ground selection transistor GST and the string selection transistor SST. In particular, the first and the second dummy cells DC1 and DC2 are interposed between the ground selection transistor GST and the memory cell MC1. Similarly, the third and the fourth dummy cells DC3 and DC4 are interposed between the string selection transistor SST and the memory cell MC32.

Because of the positioning of the dummy cells between MC1 and the GST and also between MC32 and the SST the operating characteristics of the memory cells MC1 and MC32 at both ends of the cell string may be changed such that they match those of memory cells MC2~MC31 arranged between them. As a result, all the memory cells in the cell string 110 are operable with uniform characteristics associated with programming and erasing data stored in the memory cells.

Figure 7:
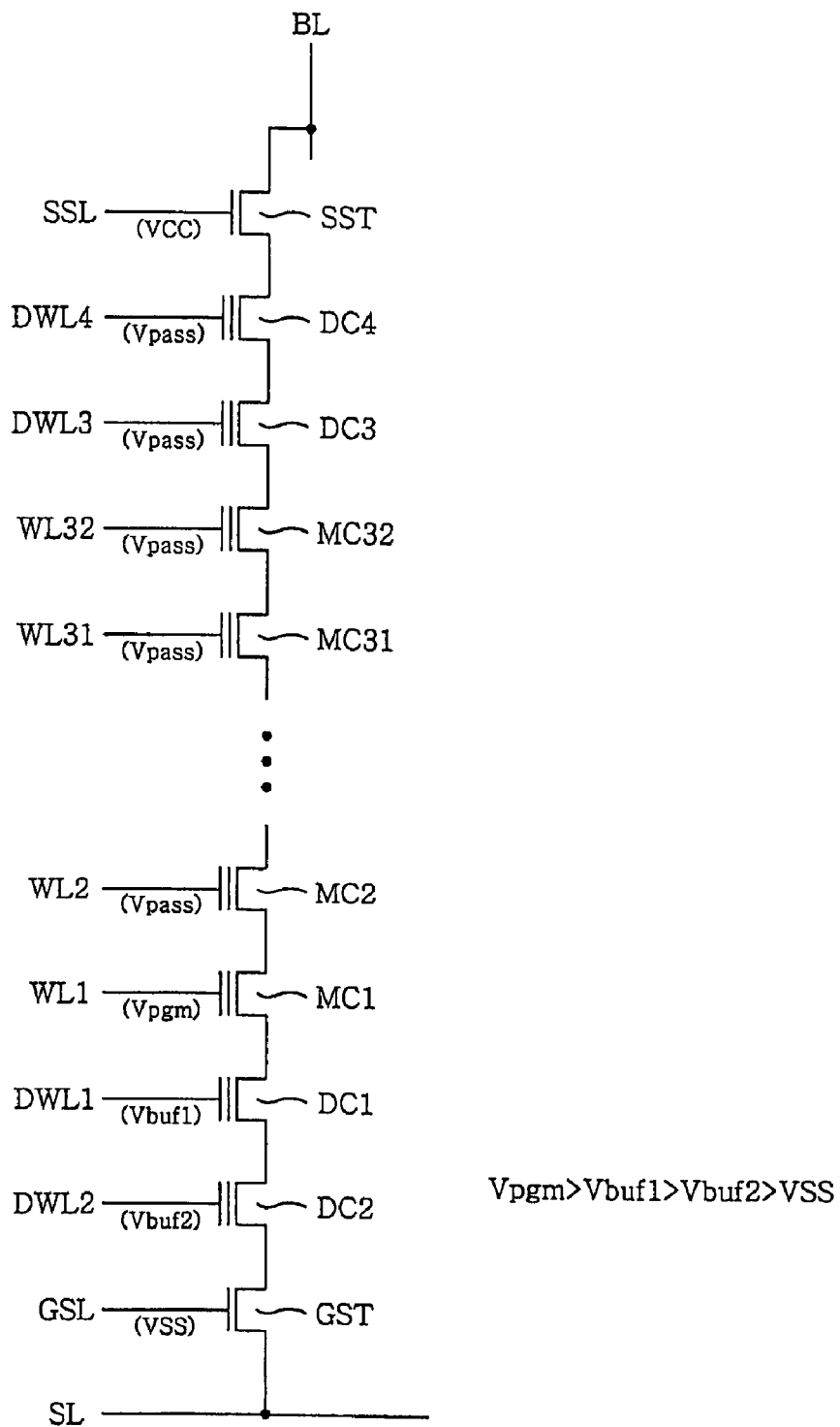
FIG. 7 and FIG. 8 are a circuit diagram and cross sectional view respectively, for explaining various voltages during a program operation for programming the memory cell on one side end of the cell string of FIG. 6.

FIG. 7 is a drawing that illustrates various voltages used during a program operation for programming the normal memory cell MC1 on one side end in the cell 110 string of FIG. 6.

Referring to FIG. 7, the first and the second dummy word lines DWL1 and DWL2 are controlled as sequential voltage levels during the program operation. These controlled voltage levels of dummy word lines DWL1 and DWL2 may be used to select the normal memory cell MC1 on the one side end of the cell string 110. In an exemplary embodiment, the sequential voltage levels are between the voltage level of the ground selection signal GSL that gates the ground selection transistor GST and the voltage level of the normal word line WL1 that gates the normal memory cell MC1 on one side end.

The voltage levels used during the program operation for programming the normal memory cell MC1 on one side end of the cell string 110 are described in detail as followings. When the normal word line WL1 is controlled as the program voltage Vpgm (example, 24V), the ground selection signal GSL is controlled as the ground voltage VSS. In this case, the first dummy word line DWL1 is controlled as a first buffer voltage Vbuf1 and the second dummy word line DWL2 is controlled as the second buffer voltage Vbuf2. In an exemplary embodiment, the relation of the first and the second buffer voltages Vbuf1, Vbuf2 with respect to the program voltage Vpgm and the ground voltage Vss is described as follows.

$$Vpgm > Vbuf1 > Vbuf2 > VSS$$

Figure 8:
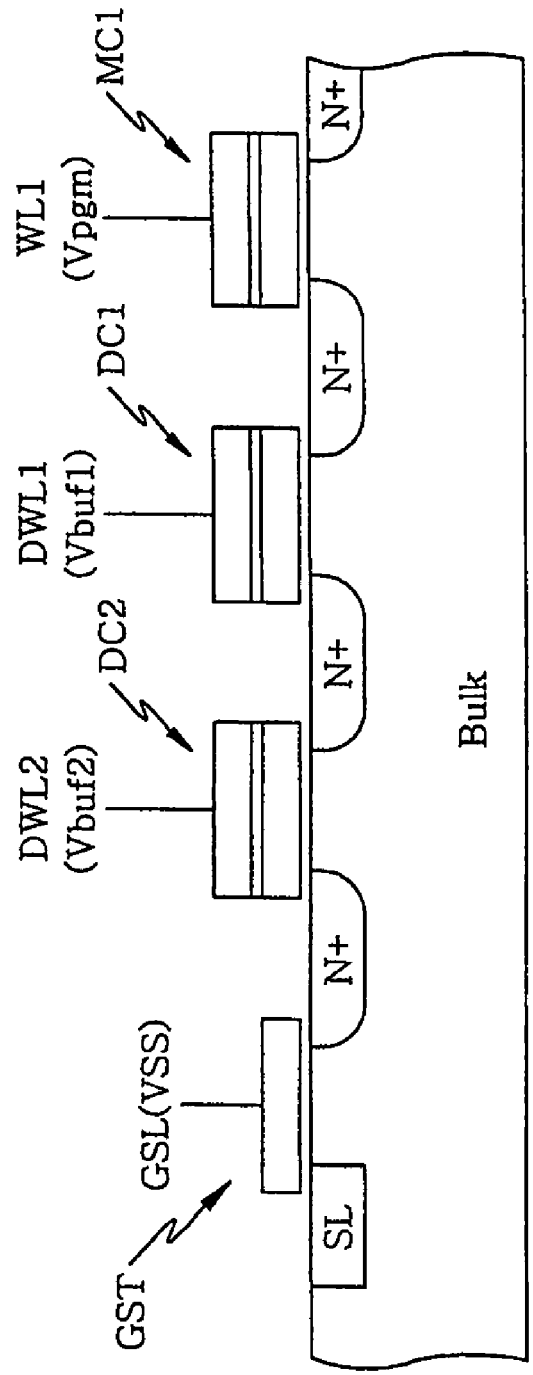

That is, the first and the second dummy word lines DWL1, DWL2 are controlled with the first and second buffer voltages Vbuf1, Vbuf2, respectively. Furthermore, the levels of the first and the second buffer voltages Vbuf1, Vbuf2 are sequentially arranged between the program voltage Vpgm of the normal word line WL1 and the ground voltage VSS of the ground selection signal GSL. Accordingly, as shown in FIG. 8, the voltage gaps among the word lines WL1, DWL1, DWL2 or the ground selection signal GSL are decreased. Therefore, the voltage gaps among the gates of the normal memory cell MC1, the dummy cells DC1, DC2, and the transistor GST are decreased. This decrease in the voltage gap between the gates of the cells may reduce the degradation of the insulating layer separating these gates.

To this end, the first and the second buffer voltages Vbuf1, Vbuf2 are beneficially controlled as per the following formula in an exemplary disclosed semiconductor memory device.

$$Vpgm - Vbuf1 = Vbuf1 - Vbuf2 = Vbuf2 - VSS \quad \{formula\ 1\}$$

In this case, the voltage gaps among the gates are minimized to the largest extent possible, so that the degradation of the insulating layer is reduced.

While the normal word line WL1 is controlled at the program voltage Vpgm (when the normal memory cell MC32 of the other end is not selected), the third and the fourth dummy word lines DWL3 and DWL4 are controlled at a pass voltage Vpass. This Vpass voltage is also used to control the remaining normal word lines WL2~WL32. Then, the third and the fourth dummy word lines DWL3, DWL4 may be easily controlled.

Furthermore, the first and the second dummy word lines DWL1, DWL2 are controlled at sequential levels between the program voltage Vpgm of the normal wordline WL1 and the ground voltage VSS. In an exemplary embodiment, these sequential levels of voltage between Vpgm and VSS are Vbuf1 and Vbuf2. The dummy cells DC1 and DC2 that are driven by buffer voltages Vbuf1 and Vbuf2 respectively, act as buffers between the normal memory cell MC1 and the ground select transistor GST. Therefore, the degradation of the insulating layer between the gates of the memory cell MC1 and the ground select transistor GST may be reduced.

Figure 9:
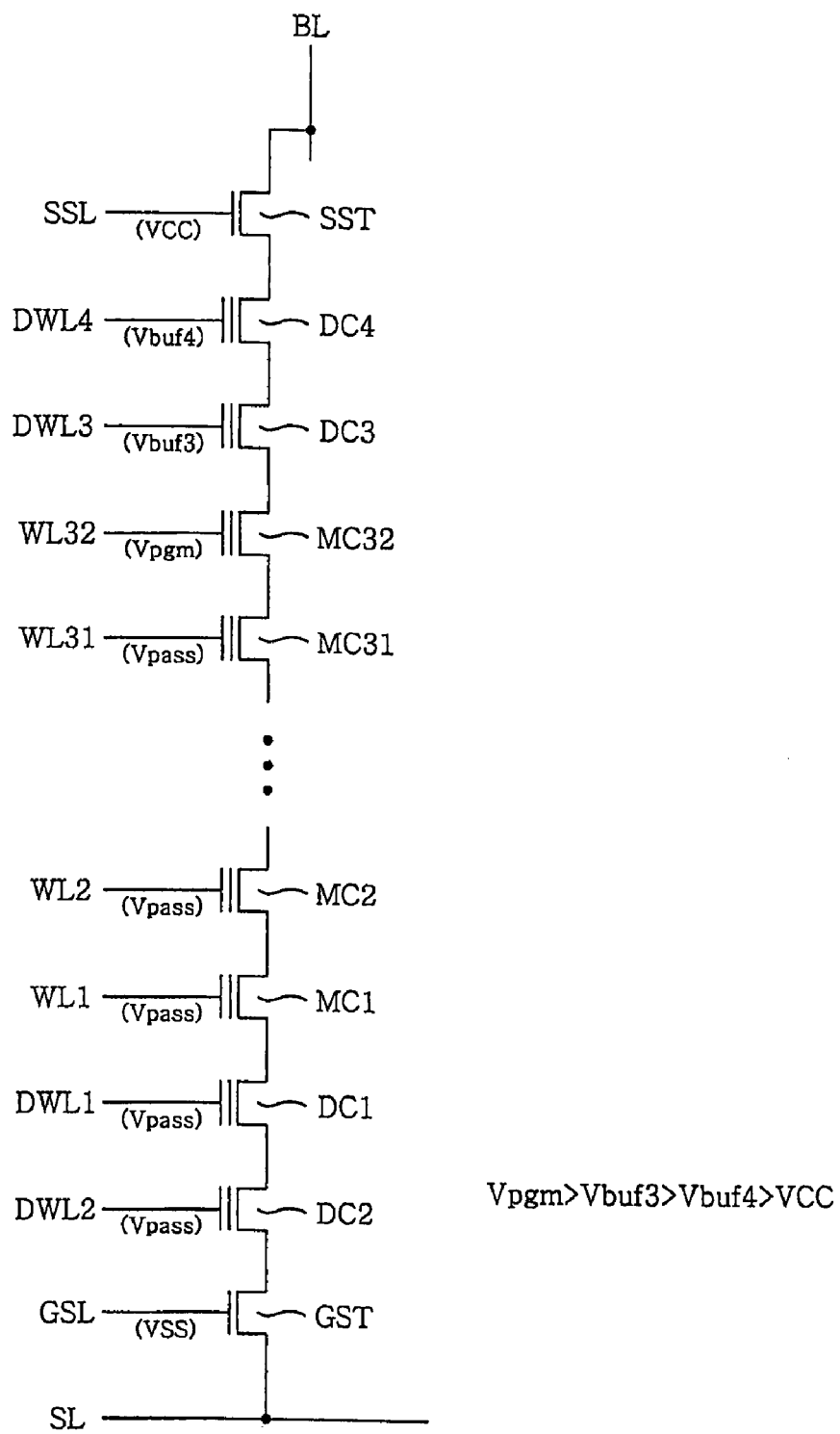
FIG. 9 is a circuit diagram for explaining various voltages during a program operation for programming the memory cell on the other side end of the cell string of FIG. 6.

FIG. 9 is a drawing for explaining various voltages used during a program operation for programming the normal memory cell MC32 on the other side end in the cell string 110 of FIG. 6. Referring to FIG. 9, the third and the fourth dummy word lines DWL3 and DWL4 are controlled at sequential voltage levels during the program operation to select the normal memory cell MC32. In this case, the sequential voltage levels are between the voltage level of the string selection signal SSL gating the string selection transistor SST and the voltage level of the normal word line WL32 gating the normal memory cell MC32.

The voltage levels used during the program operation for programming the normal memory cell MC32 are described in detail as followings. When the normal word line WL32 is controlled at the program voltage Vpgm, the string selection signal SSL is controlled at the power voltage VCC. In this case, the third dummy word line DWL3 is controlled at a third buffer voltage Vbuf3, and the fourth dummy word line DWL4 is controlled at a fourth buffer voltage Vbuf4. In this case, the relation between the third and the fourth buffer voltages Vbuf3, Vbuf4 is described by the following relationship.

$$Vpgm > Vbuf3 > Vbuf4 > VCC$$

That is to say, the levels of the third and the fourth buffer voltages Vbuf3 and Vbuf4 are sequential between the program voltage Vpgm of the normal word line WL32 and the power voltage VCC of the string selection signal SSL. Accordingly, the voltage gaps among the word lines WL32, DWL3, DWL4, and the string selection signal SSL are decreased. Therefore, the voltage gaps among the gates of the normal memory cell MC32, the dummy cells DC3, DC4, and the transistor SST are decreased. This decrease in the voltage gaps between the gates of the above-mentioned transistors may reduce the degradation of the insulating layer separating these gates.

Beneficially, the third and the fourth buffer voltages Vbuf3, Vbuf4 are controlled by the following formula.

$$Vpgm - Vbuf3 = Vbuf3 - Vbuf4 = Vbuf4 - VCC \quad \{formula\ 2\}$$

In this case, the voltage gaps among the gates are minimized to the maximum extent possible, so that the degradation phenomenon of insulating layer is decreased.

While the normal word line WL32 is controlled at the program voltage Vpgm (when the normal memory cell MC1 of the one end is not selected), the first and the second dummy word lines DWL1 and DWL2 are controlled at a pass voltage Vpass. This Vpass voltage is also used to control the remaining normal word lines WL1~WL31. Then, the first and the second dummy word lines DWL1, DWL1 may be easily controlled.

Furthermore, the third and the fourth dummy word lines DWL3, DWL4 are controlled as sequential levels between the program voltage Vpgm of the normal wordline WL32 and the power voltage VCC. In an exemplary embodiment, these sequential levels of voltage between Vpass and VCC are Vbuf3 and Vbuf4. The dummy cells DC3 and DC4 that are driven by buffer voltages Vbuf3 and Vbuf4 respectively, act as buffers between the normal memory cell MC32 and the string select transistor SST. Therefore, the degradation of the insulating layer between the gates of the memory cell MC32 and the string select transistor SST may be reduced.

Figure 10:
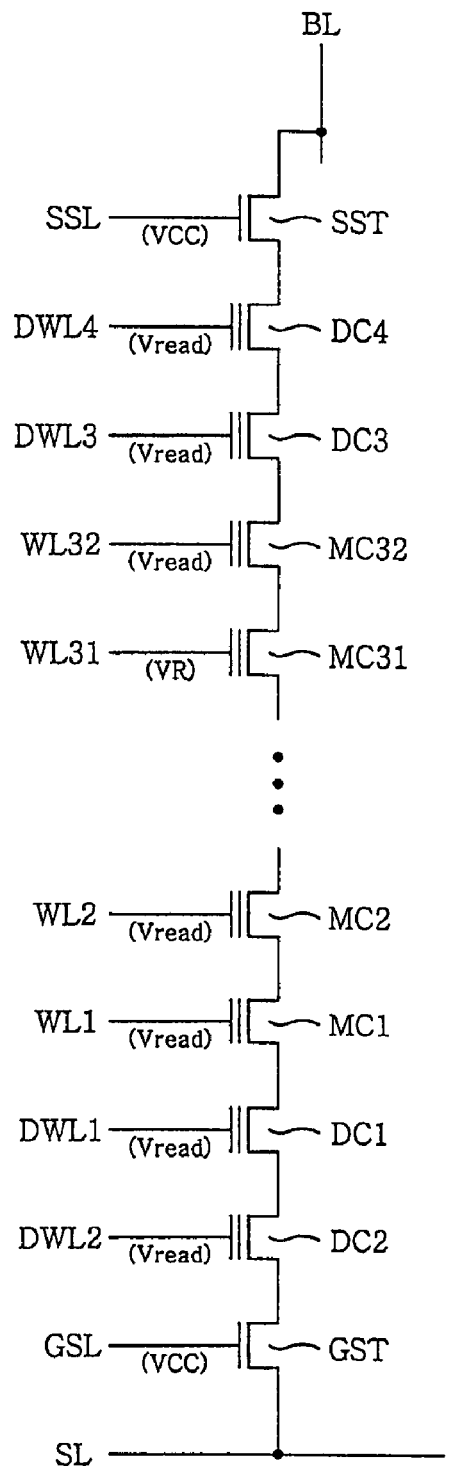
FIG. 10 is a drawing for explaining various voltages used during a read operation for the cell string of FIG. 6.

FIG. 10 is a drawing for explaining various voltages used during a read operation for the cell string 110 of FIG. 6. Referring to FIG. 10, the normal wordline WL31 of the selected memory cell MC31 is controlled as a reference voltage VR. In this case, the dummy word lines DWL1, DWL2, DWL3, and DWL4 are controlled as a read voltage Vread, similar to the normal word lines WL1~WL32.

Here, the programming operation performed on the normal memory cell MC31 may be verified by the reference voltage VR. That is, the reference voltage is higher than the threshold voltage of the normal memory cell MC31 in the programmed state, but is lower than the threshold voltage of the normal memory cell MC31 in the erased state. In addition, the normal memory cell MC31 may be turned on by the read voltage Vread, regardless of whether the normal memory cell MC31 is programmed or not.

Figure 11:
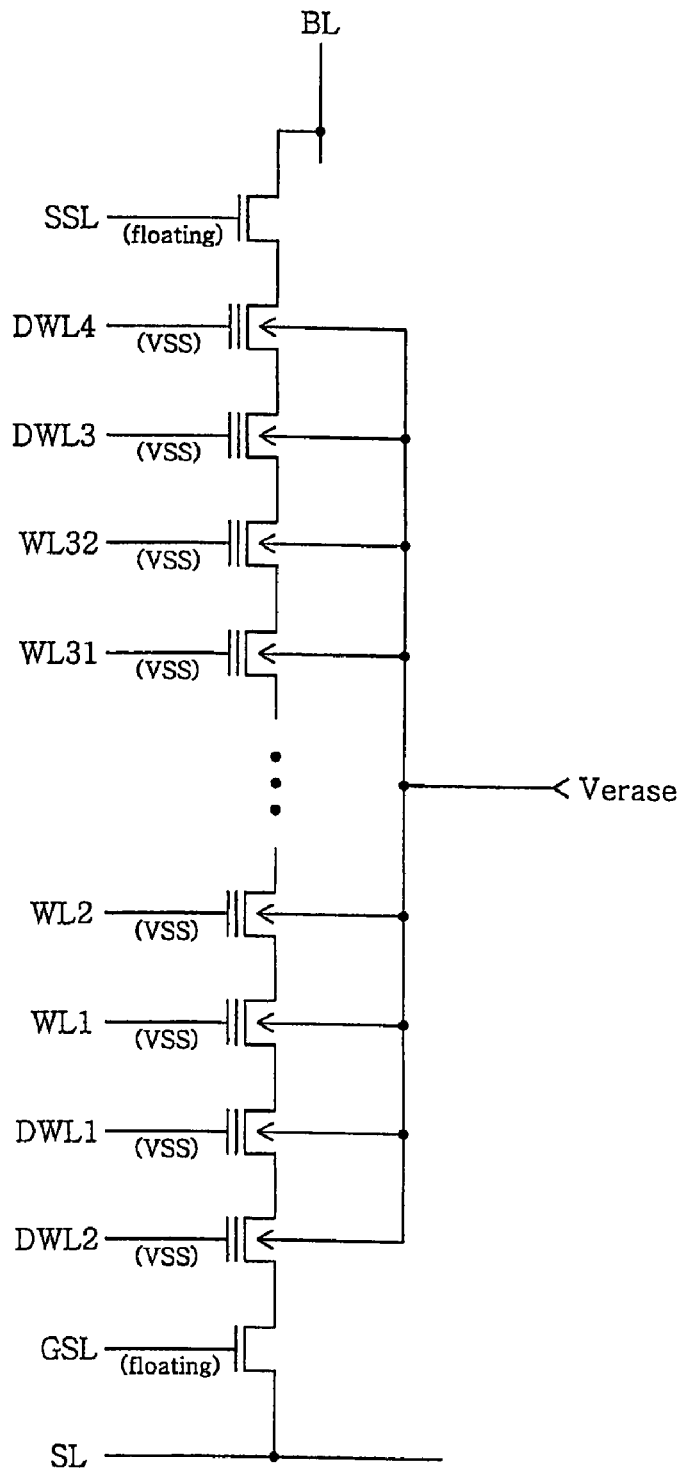
FIG. 11 is a drawing for explaining various voltages used during an erase operation for the cell string of FIG. 6.

FIG. 11 is a drawing for explaining various voltages used during the erase operation for the cell string 110 of FIG. 6. Referring to FIG. 11, the string selection transistor SST and the ground select transistor GST are controlled at a floating state. Furthermore, an erase voltage Verase is applied to the bulk of the memory cells.

Returning to FIG. 5, as mentioned above, the wordline selection block 300 includes the normal wordline selection circuit 310, and the dummy wordline selection circuit 330. The normal word line selection circuit 310 is controlled to drive the normal word lines WL1~WL32 in response to a normal word line address NWADD. The world line address NWADD is a portion of a row address. In addition, the dummy word line selection circuit 330 is controlled to drive the dummy word lines DWL1~DWL4 in response to dummy word line address DWADD which is another portion of the row address.

Beneficially, the nonvolatile semiconductor memory device further includes a voltage generating block 400. The voltage generation block 400 generates various voltages being used for the operation of the nonvolatile semiconductor memory device. For example, the voltage generation block 400 generates the program voltage Vpgm, the pass voltage Vpass, the reference voltage VR, the read voltage Vread, the erase voltage Verase, and the buffer voltages Vbuf1~Vbuf4, and provides them to the normal wordline selection circuit 310 and/or the dummy wordline selection circuit 330.

The disclosed nonvolatile semiconductor memory device may be used in any memory system. As described above the first and the second dummy cells are interposed between the ground selection transistor and the memory cell on one end of the cell string. Furthermore the third and the fourth dummy cells are interposed between the string selection transistor and the memory cell on the other end of the cell string. Thus, in the disclosed nonvolatile semiconductor memory device, all the memory cells are conditioned in the same physical states with their adjacent correlations. As a result, all the memory cells are operable under the same operating conditions. These operating conditions may include, for example, program, read, and erase operations.

Furthermore, the gates of the two dummy cells being interposed between the normal memory cell and the selection transistor are controlled with sequential voltages. Therefore, the degradation of the insulating layer separating these gates may be reduced.

Although preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the technical scope of the present invention should be defined by the technical spirit of the accompanying claims.

What is claimed is:

1. A non-volatile semiconductor memory device, comprising:
   a memory array having a cell string, the cell string including:
      a plurality of normal memory cells connected serially to each other;
      a ground selection transistor gated so as to provide a source voltage to the normal memory cells; and
      at least two dummy cells connected serially between a normal memory cell on one side end of the plurality of normal memory cells and the ground selection transistor, wherein the plurality of normal memory cells and the dummy cells are non-volatile, the normal memory cells being configured to store data and the dummy cells being configured to not store data; and a word line selection block which controls normal word lines to gate the normal memory cells and dummy word lines to gate the dummy cells, wherein the dummy word lines are controlled as sequential voltage levels during a program operation to select the normal memory cell on the one side end, the sequential voltage levels being different from each other and each being between a voltage level of a signal gating the ground selection transistor and a voltage level of a normal word line gating the normal memory cell on the one side end.

2. The non-volatile semiconductor memory device of claim 1, wherein the dummy word lines are controlled to the same voltage level as the voltage level of a normal word line gating a normal memory cell on the one side end of the cell string during the program operation to non-select the normal memory cell on the other side end of the cell string.

3. The non-volatile semiconductor memory device of claim 1, wherein the dummy word lines are controlled as sequential voltage levels during the program operation to non-select a normal memory cell on the other side end of the cell string, wherein the sequential voltage levels are between the voltage level of the signal gating the ground selection transistor and the voltage level of the normal word line gating the normal memory cell on the one side end of the cell string.

4. The non-volatile semiconductor memory device of claim 1, wherein the dummy word lines are controlled to the same voltage level as the voltage level of the normal word line gating the normal memory cell on the one side end during an erase operation.

5. The non-volatile semiconductor memory device of claim 1, wherein the dummy word lines are controlled to the same voltage level as a voltage level of a normal word line gating a normal memory cell which is non-selected during a read operation.

6. The non-volatile semiconductor memory device of claim 1, wherein the word line selection block comprises:
   a normal word line selection circuit which selects the normal word lines; and
   a dummy word line selection circuit which selects the dummy word lines.

7. A non-volatile semiconductor memory device, comprising:
   a memory array having a cell string, the cell string including:
     a plurality of normal memory cells connected serially to each other;
     a string selection transistor, gated so as to electrically connect the normal memory cells with a bitline; and
     at least two dummy cells being connected serially between a normal memory cell on one side end of the plurality of normal memory cells and the string selection transistor, wherein the plurality of normal memory cells and the dummy cells are non-volatile, the normal memory cells being configured to store data and the dummy cells being configured to not store data; and
   a word line selection block which controls normal word lines to gate the normal memory cells and dummy word lines to gate the dummy cells,
   wherein the dummy word lines of the dummy cells are controlled as sequential voltage levels during a program operation to select the normal memory cell on the one side end, the sequential voltage levels being different from each other and each between a voltage level of a signal gating the string selection transistor and a voltage level of the normal word line gating the normal memory cell of the one side end.

8. The non-volatile semiconductor memory device of claim 7, wherein the dummy word lines are controlled to the same voltage level as a voltage level of the normal word line gating the normal memory cell of the one side end during the program operation to non-select a normal memory cell on the other side end.

9. The non-volatile semiconductor memory device of claim 7, wherein the dummy word lines of the dummy cells are controlled as sequential voltage levels during the program operation to non-select a normal memory cell on the other side end, wherein the sequential voltage levels are between the voltage level of the signal gating the string selection transistor and the voltage level of the normal word line gating the normal memory cell on the one side end.

10. The non-volatile semiconductor memory device of claim 7, wherein the dummy word lines are controlled to the same voltage level as the voltage level of the normal word line gating the normal memory cell on the one side end during an erase operation.

11. The non-volatile semiconductor memory device of claim 7, wherein the dummy word lines are controlled to the same voltage level as a voltage level of a normal word line gating a normal memory cell which is non-selected during a read operation.

12. A non-volatile semiconductor memory device, comprising:
   a memory array having a cell string, the cell string including:
     a plurality of normal memory cells connected serially to each other;
     a ground selection transistor gated so as to provide a source voltage to the normal memory cells;
     a first and a second dummy cell being connected serially between a normal memory cell on one side end of the plurality of normal memory cells and the ground selection transistor;
     a string selection transistor gated so as to electrically connect the normal memory cells with a bitline; and
     a third and a fourth dummy cell being connected serially between a normal memory cell on the other side end of the plurality of normal memory cells and the string selection transistor, wherein the plurality of normal memory cells and the dummy cells are non-volatile, the normal memory cells being configured to store data and the dummy cells being configured to not store data; and
   a word line selection block which controls normal word lines to gate the normal memory cells and dummy word lines to control a first, a second, a third, and a fourth dummy word line to gate the first, the second, the third and the fourth dummy cells, respectively, wherein the first and the second dummy word lines are controlled as first sequential voltage levels during a program operation to select the normal memory cell on the one side end, the first sequential voltage levels being different from each other and being between a voltage level of a signal gating the ground selection transistor and a voltage level of a normal word line gating the normal memory cell on the one side end.

13. The non-volatile semiconductor memory device of the claim 10, wherein the third and the fourth dummy word lines are controlled as second sequential voltage levels during the program operation to select the normal memory cell of the other side end, the second sequential voltage levels being different from each other and being between a voltage level of a signal gating the string selection transistor and a voltage level of a normal word line gating the normal memory cell on the other side end.

14. The non-volatile semiconductor memory device of claim 1, wherein a voltage level among the sequential voltage levels that controls a dummy line adjacent the selected normal memory cell during the program operation is greater than a voltage level among the sequential voltage levels that controls a dummy line adjacent the ground selection transistor during the program operation.

15. The non-volatile semiconductor memory device of claim 7, wherein a voltage level among the sequential voltage levels that controls a dummy line adjacent the selected normal memory cell during the program operation is greater than a voltage level among the sequential voltage levels that controls a dummy line adjacent the string selection transistor during the program operation.

16. The non-volatile semiconductor memory device of claim 13, wherein a voltage level among the first sequential voltage levels that controls a dummy line adjacent the selected normal memory cell during the program operation is greater than a voltage level among the first sequential voltage levels that controls a dummy line adjacent the ground selection transistor during the program operation, and a voltage level among the second sequential voltage levels that controls a dummy line adjacent the selected normal memory cell during the program operation is greater than a voltage level among the second sequential voltage levels that controls a dummy line adjacent the string selection transistor during the program operation.

* * * * *